United States Patent
Liu

(10) Patent No.: US 10,409,165 B2
(45) Date of Patent: Sep. 10, 2019

(54) OPTIMIZATION BASED ON MACHINE LEARNING

(71) Applicant: ASML Netherlands B.V., Veldhoven (NL)

(72) Inventor: Xiaofeng Liu, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 15 days.

(21) Appl. No.: 15/528,034

(22) PCT Filed: Nov. 18, 2015

(86) PCT No.: PCT/EP2015/077010
§ 371 (c)(1),
(2) Date: May 18, 2017

(87) PCT Pub. No.: WO2016/096309
PCT Pub. Date: Jun. 23, 2016

(65) Prior Publication Data
US 2018/0314163 A1    Nov. 1, 2018

Related U.S. Application Data

(60) Provisional application No. 62/092,081, filed on Dec. 15, 2014.

(51) Int. Cl.
*G06F 17/50* (2006.01)
*G03F 7/20* (2006.01)
*G06N 20/00* (2019.01)

(52) U.S. Cl.
CPC ...... *G03F 7/70125* (2013.01); *G03F 7/70441* (2013.01); *G03F 7/70491* (2013.01);
(Continued)

(58) Field of Classification Search
CPC .... G03F 7/705; G03F 7/70525; G03F 7/7065; G03F 1/84; H01L 22/20; H01L 22/14;
(Continued)

(56) References Cited

U.S. PATENT DOCUMENTS 5,229,872 A    7/1993  Mumola
5,296,891 A    3/1994  Vogt et al.
(Continued)

FOREIGN PATENT DOCUMENTS

TW    201423090    6/2014
TW    201437737    10/2014
WO    WO 2010/059954    5/2010

OTHER PUBLICATIONS

English translation of Taiwan Office Action dated Dec. 26, 2017 in corresponding Taiwan Patent Application No. 106108969.
(Continued)

*Primary Examiner* — Nghia M Doan
(74) *Attorney, Agent, or Firm* — Pillsbury Winthrop Shaw Pittman LLP

(57) ABSTRACT

A method for improving a lithographic process for imaging a portion of a design layout onto a substrate using a lithographic apparatus, the method including: obtaining a first source of the lithographic apparatus; classifying the first source into a class among a plurality of possible classes, based on one or more numerical characteristics of the first source, using a machine learning model, by a computer; determining whether the class is among one or more predetermined classes; only when the class is among the one or more predetermined classes, adjusting one or more source design variables to obtain a second source.

20 Claims, 12 Drawing Sheets

(52) U.S. Cl.
CPC .......... *G06F 17/50* (2013.01); *G06F 17/5009* (2013.01); *G06N 20/00* (2019.01)

(58) Field of Classification Search
CPC .. G06F 17/5081; G06F 17/5009; G06F 17/50; G06N 7/005; G06N 99/005
USPC .................................... 716/50–56; 430/5, 30
See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 8,200,468 | B2 | 6/2012 | Ye et al. |
| 8,438,508 | B2 | 5/2013 | Liu |
| 8,464,194 | B1 | 6/2013 | Agarwal et al. |
| 8,786,824 | B2 | 7/2014 | Hansen |
| 2010/0315614 | A1 | 12/2010 | Hansen |
| 2012/0123581 | A1* | 5/2012 | Smilde ................ G03F 7/70483 700/105 |
| 2013/0036390 | A1* | 2/2013 | Torres Robles .... G06F 17/5068 716/54 |
| 2014/0358830 | A1* | 12/2014 | Chiang ................ G06N 99/005 706/12 |
| 2015/0378262 | A1 | 12/2015 | Liu et al. |
| 2017/0109646 | A1* | 4/2017 | David ..................... G03F 7/705 |

OTHER PUBLICATIONS

International Search Report and Written Opinion dated Jan. 28, 2016 in corresponding International Patent Application No. PCT/EP2015/077010.

Jia, Ningning et al., "Machine learning for inverse lithography: Using stochastic gradient descent for robust photomask synthesis," Journal of Optics, vol. 12, pp. 045601 (9 pages) (2010).

Li, Jai et al., "Efficient source and mask optimization with augmented Lagrangian methods in optical lithography", Optics Express, vol. 21, No. 7, pp. 8076-8090 (Mar. 2013).

Spence, Chris, "Full-Chip Lithography Simulation and Design Analysis—How OPC Is Changing IC Design," Proc. SPIE, vol. 5751, pp. 1-14 (2005).

Cao, Yu et al., "Optimized Hardware and Software for Fast, Full Chip Simulation," Proc. of SPIE, vol. 5754, pp. 407-414 (2005).

Rosenbluth, Alan E. et al., "Optimum mask and source patterns to print a given shape," J. Microlith., Microfab., Microsys., vol. 1, No. 1, pp. 13-30 (Apr. 2002).

Granik, Yuri, "Source optimization for image fidelity and throughput," J. Microlith., Microfab., Microsys., vol. 3, No. 4, pp. 509-522 (Oct. 2004).

Socha, Robert et al., "Simultaneous Source Mask Optimization (SMO)," Proc. of SPIE, vol. 5853, pp. 180-193 (2005).

\* cited by examiner

OPTIMIZATION BASED ON MACHINE LEARNING

CROSS-REFERENCE TO RELATED APPLICATIONS

This application is the U.S. national phase entry of PCT patent application no. PCT/EP2015/077010, which was filed on Nov. 18, 2015, which claims the benefit of priority of U.S. provisional patent application No. 62/092,081, which was filed on Dec. 15, 2014 and which is incorporated herein in its entirety by reference.

TECHNICAL FIELD

The description herein relates to lithographic apparatuses and processes, and more particularly to a method or tool for optimization of an illumination source and/or patterning device/design layout for use in a lithographic apparatus or process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g., comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a computer-implemented method for improving a lithographic process for imaging a portion of a design layout onto a substrate using a lithographic apparatus, the method comprising: obtaining a first source of the lithographic apparatus; classifying the first source into a class among a plurality of possible classes, based on one or more numerical characteristics of the first source, using a machine learning model, by a computer; determining whether the class is among one or more predetermined classes; only when the class is among the one or more predetermined classes, adjusting one or more source design variables to obtain a second source.

Also disclosed herein is a computer-implemented method for obtaining an element of a training set from a source of a lithographic apparatus suitable for a lithographic process for imaging a portion of a design layout onto a substrate, the method comprising: calculating a value of a cost function for the source; determining a class of the value of the cost function among a plurality of possible classes; and forming the element by combining numerical characteristics of the source and the class.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
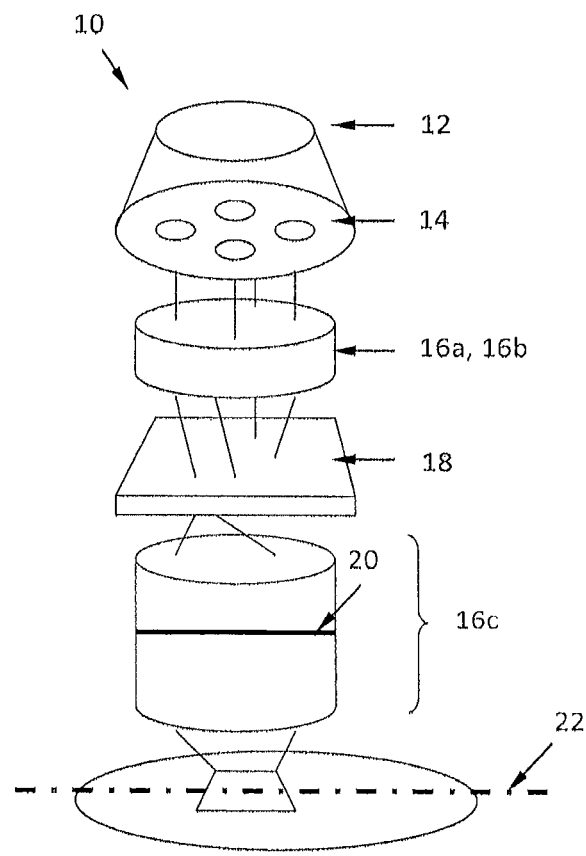
FIG. 1 is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD = k_1 \times \lambda / NA$, where $\lambda$ is the wavelength of radiation employed (currently in most cases 248 nm or 1.93 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results. As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprise design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
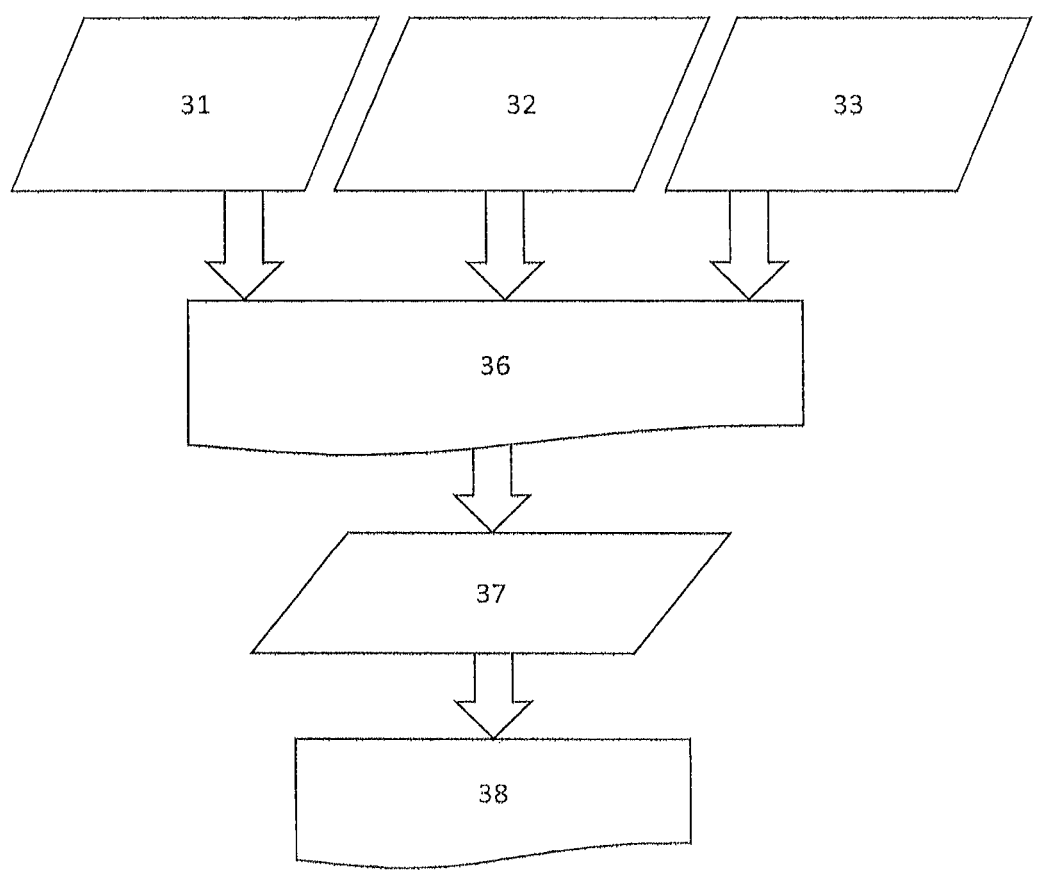
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

In one or more embodiments, optimization can be performed using a cost function, such as $$CF(z_1,z_2,\ldots,z_N)=\sum_{p=1}^{P} w_p f_p^2(z_1,z_2,\ldots,z_N) \quad \text{(Eq. 1)}$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. The design variables may have continuous or discrete values. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a design layout, or resist image, or aerial image.

The cost function may represent any suitable characteristics of the lithographic projection apparatus or the substrate, for instance, focus, CD, image shift, image distortion, image rotation, etc. For example, the cost function may be a function of one or more of the following lithographic metrics: edge placement error, critical dimension, resist contour distance, worst defect size, stochastic effect, three-dimensional effect of the patterning device, three-dimensional effect of the resist, best focus shift, pupil fill factor, exposure time, and throughput. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called a "wavefront manipulator" that can be used to adjust shapes of a wavefront and intensity distribution and/or phase shift of the irradiation beam. The projection optics can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, and/or thermal expansion of components of the lithographic projection apparatus. Adjusting the wavefront and intensity distribution can change values of the evaluation points and the cost function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $CF(z_1, z_2, \ldots, z_N)=\sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

Further, if the PW (Process Window) is maximized, it is possible to consider the same physical location from different PW conditions as different evaluation points in the cost function in (Eq. 1). For example, if N PW conditions are considered, then the evaluation points can be categorized according to their PW conditions and the cost functions can be written as:

$$CF(z_1,z_2,\ldots,z_N)=\sum_{p=1}^{P} w_p f_p^2(z_1,z_2,\ldots,z_N)$$
$$=\sum_{u=1}^{U}\sum_{p_u=1}^{P_u} w_{p_u} f_{p_u}^2(z_1,z_2,\ldots,z_N) \quad \text{(Eq. 1')}$$

where $f_{p_u}(z_1, z_2, \ldots, z_N)$ is a function of the difference between an actual value and an intended value of the $p_i$-th evaluation point for a set of values of the design variables of $(z_1, z_2, \ldots, z_N)$ under the u-th PW condition $u=1, \ldots, U$. When this difference is the edge placement error (EPE), then minimizing the above cost function is equivalent to minimizing the edge shift under various PW conditions, thus this leads to maximizing the PW. In particular, if the PW also consists of different patterning device bias, then minimizing the above cost function also includes the minimization of MEEF (Mask Error Enhancement Factor), which is defined as the ratio between the wafer EPE and the induced mask edge bias.

The design variables or functions thereof may have constraints, which can be expressed as $(z_1, z_2, \ldots, z_N) \in Z$, where Z is a set of possible values of the design variables. The constraints may represent physical restrictions in a hardware implementation of the lithographic projection apparatus. The constraints may include one or more of: tuning ranges, rules governing patterning device manufacturability, and interdependence between the design variables.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) = \arg\min_{(z_1, z_2, \ldots, z_N) \in Z} \sum_{p=1}^{P} w_p f_p^2(z_1, z_2, \ldots, z_N) \quad \text{(Eq. 2)}$$

Figure 3:
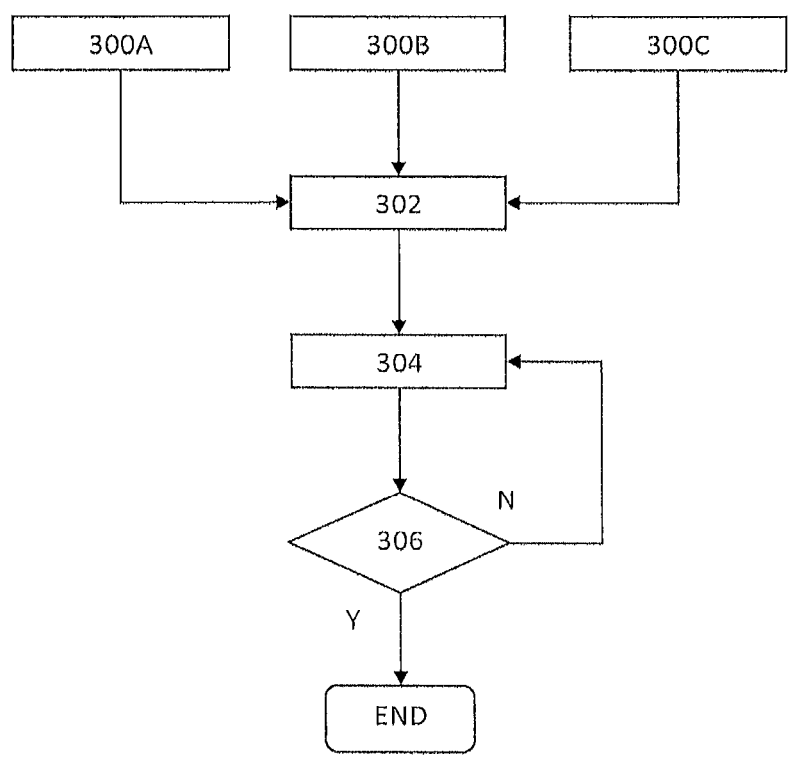
FIG. 3 shows a flow chart of a general method of optimizing the lithography projection apparatus.

A general method of optimizing the lithography projection apparatus, according to an embodiment, is illustrated in FIG. 3. This method comprises a step 302 of defining a multi-variable cost function of a plurality of design variables. The design variables may comprise any suitable combination selected from characteristics of the illumination source (300A) (e.g., pupil fill ratio, namely percentage of radiation of the source that passes through a pupil or aperture), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to an SMO. Alternatively, the design variables may include characteristics of the illumination source (300A), characteristics of the projection optics (300B) and characteristics of the design layout (300C), which leads to a source-mask-lens optimization (SMLO). In step 304, the design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step 306 is satisfied, the method ends. If none of the conditions in step 306 is satisfied, the step 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In another embodiment, instead of, or in addition to, calculating and/or determining the effect on the optical characteristics of the projection optics, it is envisioned that adjustable optical characteristics of the projection optics can be included in the design variables. Exemplary adjustable optical characteristics may include as lens manipulators, the temperature data or signal associated with the temperature data of one or more devices, e.g. heaters, utilized to control the temperature of an optical element of the projection system, Zernike coefficients. The SMO procedure can then be carried out and the design variables, including the adjustable optical characteristics, can be simultaneously adjusted so that the cost function is moved towards convergence.

Figure 4:
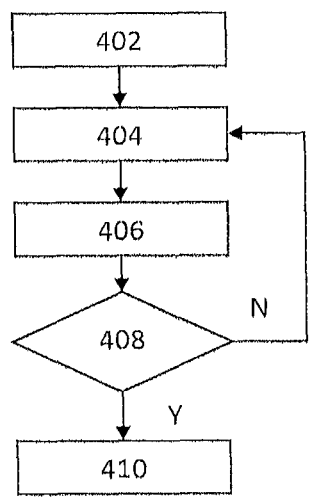
FIG. 4 shows a flow chart of a method of optimizing the lithography projection apparatus where the optimization of all the design variables is executed alternately.

In FIG. 3, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the source, patterning device, projection optics and/or any other design variables, are allowed to change at the same time. Alternatively, the optimization of all the design variables is executed alternately, as illustrated in FIG. 4. In this flow, in each step, some design variables are fixed while the other design variables are optimized to minimize the cost function; then in the next step, a different set of variables are fixed while the others are optimized to minimize the cost function. These steps are executed alternately until convergence or certain terminating conditions are met. As shown in the non-limiting example flowchart of FIG. 4, first, a design layout (step 402) is obtained, then a step of source optimization is executed in step 404, where all the design variables of the illumination source are optimized (SO) to minimize the cost function while all the other design variables are fixed. Then in the next step 406, a mask optimization (MO) is performed, where all the design variables of the patterning device are optimized to minimize the cost function while all the other design variables are fixed. These two steps are executed alternately, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternate-Optimization is used as an example for the alternate flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on. Finally the output of the optimization result is obtained in step 410, and the process stops.

The methods of FIG. 3 and FIG. 4 focus on local minimums of the cost function and thus may miss superior global minimums. Monte-Carlo algorithms may be used to find global minimums but would be computationally expensive because they involve finding local minimums (e.g. using the methods of FIG. 3 and FIG. 4) around many randomly selected starting positions in the space of the design variables. Machine learning algorithms may be useful to accelerate Monte-Carlo algorithms by filtering the randomly selected starting positions Monte-Carlo algorithms generate before trying to find local minimums around them. Namely, machine learning algorithms can serve as a gatekeeper that eliminates the need of finding local minimums around those starting positions that are unlikely to have local minimums nearby. Both unsupervised machine learning and supervised machine learning algorithms may be used. Without limiting the scope of the claims, applications of supervised machine learning algorithms with Monte-Carlo algorithms are described below.

Supervised learning is the machine learning task of inferring a function from labeled training data. The training data consist of a set of training examples. In supervised learning, each example is a pair consisting of an input object (typically a vector) and a desired output value (also called the supervisory signal). A supervised learning algorithm analyzes the training data and produces an inferred function, which can be used for mapping new examples. An optimal scenario will allow the algorithm to correctly determine the class labels for unseen instances. This requires the learning algorithm to generalize from the training data to unseen situations in a "reasonable" way (see inductive bias).

Given a set of N training examples of the form $\{(x_1, y_1), (x_2, y_2), \ldots, (x_N, y_N)\}$ such that $x_i$ is the feature vector of the i-th example and $y_i$ is its label (i.e., class), a learning algorithm seeks a function g: $X \rightarrow Y$, where X is the input space and Y is the output space. A feature vector is an n-dimensional vector of numerical features that represent some object. Many algorithms in machine learning require a numerical representation of objects, since such representations facilitate processing and statistical analysis. When representing images, the feature values might correspond to the pixels of an image, when representing texts perhaps term occurrence frequencies. The vector space associated with these vectors is often called the feature space. The function g is an element of some space of possible functions G, usually called the hypothesis space. It is sometimes convenient to represent g using a scoring function f: $X \times Y \rightarrow \mathbb{R}$ such that g is defined as returning the y value that gives the highest score: $g(x) = \arg\max_y f(x, y)$. Let F denote the space of scoring functions.

Although G and F can be any space of functions, many learning algorithms are probabilistic models where g takes the form of a conditional probability model $g(x) = P(y|x)$, or f takes the form of a joint probability model $f(x, y) = P(x, y)$. For example, naive Bayes and linear discriminant analysis are joint probability models, whereas logistic regression is a conditional probability model.

There are two basic approaches to choosing for g: empirical risk minimization and structural risk minimization. Empirical risk minimization seeks the function that best fits the training data. Structural risk minimize includes a penalty function that controls the bias/variance tradeoff.

In both cases, it is assumed that the training set consists of a sample of independent and identically distributed pairs, $(x_i, y_i)$. In order to measure how well a function fits the training data, a loss function L: $Y \times Y \rightarrow \mathbb{R}^{\geq 0}$ is defined. For training example $(x_i, y_i)$, the loss of predicting the value $\hat{y}$ is $L(y_i, \hat{y})$.

The risk R(g) of function g is defined as the expected loss of g. This can be estimated from the training data as $$R_{emp}(g) = \frac{1}{N} \sum_i L(y_i, g(x_i)).$$

Exemplary models of supervised learning include Decision trees, Ensembles (Bagging, Boosting, Random forest), k-NN, Linear regression, Naive Bayes, Neural networks, Logistic regression, Perceptron, Support vector machine (SVM), Relevance vector machine (RVM), and deep learning.

SVM is an example of supervised learning model, which analyzes data and recognize patterns and can be used for classification and regression analysis. Given a set of training examples, each marked as belonging to one of two categories, an SVM training algorithm builds a model that assigns new examples into one category or the other, making it a non-probabilistic binary linear classifier. An SVM model is a representation of the examples as points in space, mapped so that the examples of the separate categories are divided by a clear gap that is as wide as possible. New examples are then mapped into that same space and predicted to belong to a category based on which side of the gap they fall on.

In addition to performing linear classification, SVMs can efficiently perform a non-linear classification using what is called the kernel methods, implicitly mapping their inputs into high-dimensional feature spaces.

Kernel methods require only a user-specified kernel, i.e., a similarity function over pairs of data points in raw representation. Kernel methods owe their name to the use of kernel functions, which enable them to operate in a high-dimensional, implicit feature space without ever computing the coordinates of the data in that space, but rather by simply computing the inner products between the images of all pairs of data in the feature space. This operation is often computationally cheaper than the explicit computation of the coordinates. This approach is called the "kernel trick."

The effectiveness of SVM depends on the selection of kernel, the kernel's parameters, and soft margin parameter C. A common choice is a Gaussian kernel, which has a single parameter $\gamma$. The best combination of C and $\gamma$ is often selected by a grid search (also known as "parameter sweep") with exponentially growing sequences of C and $\gamma$, for example, $C \in \{2^{-5}, 2^{-4}, \ldots, 2^{15}, 2^{16}\}$; $\gamma \in \{2^{-15}, 2^{-14}, \ldots, 2^4, 2^5\}$.

A grid search is an exhaustive searching through a manually specified subset of the hyperparameter space of a learning algorithm. A grid search algorithm must be guided by some performance metric, typically measured by cross-validation on the training set or evaluation on a held-out validation set.

Each combination of parameter choices may be checked using cross validation, and the parameters with best cross-validation accuracy are picked.

Cross-validation, sometimes called rotation estimation, is a model validation technique for assessing how the results of a statistical analysis will generalize to an independent data set. It is mainly used in settings where the goal is prediction, and one wants to estimate how accurately a predictive model will perform in practice. In a prediction problem, a model is usually given a dataset of known data on which training is run (training dataset), and a dataset of unknown data (or first seen data) against which the model is tested (testing dataset). The goal of cross validation is to define a dataset to "test" the model in the training phase (i.e., the validation dataset), in order to limit problems like overfitting, give an insight on how the model will generalize to an independent data set (i.e., an unknown dataset, for instance from a real problem), etc. One round of cross-validation involves partitioning a sample of data into complementary subsets, performing the analysis on one subset (called the training set), and validating the analysis on the other subset (called the validation set or testing set). To reduce variability, multiple rounds of cross-validation are performed using different partitions, and the validation results are averaged over the rounds.

The final model, which is used for testing and for classifying new data, is then trained on the whole training set using the selected parameters.

Figure 5:
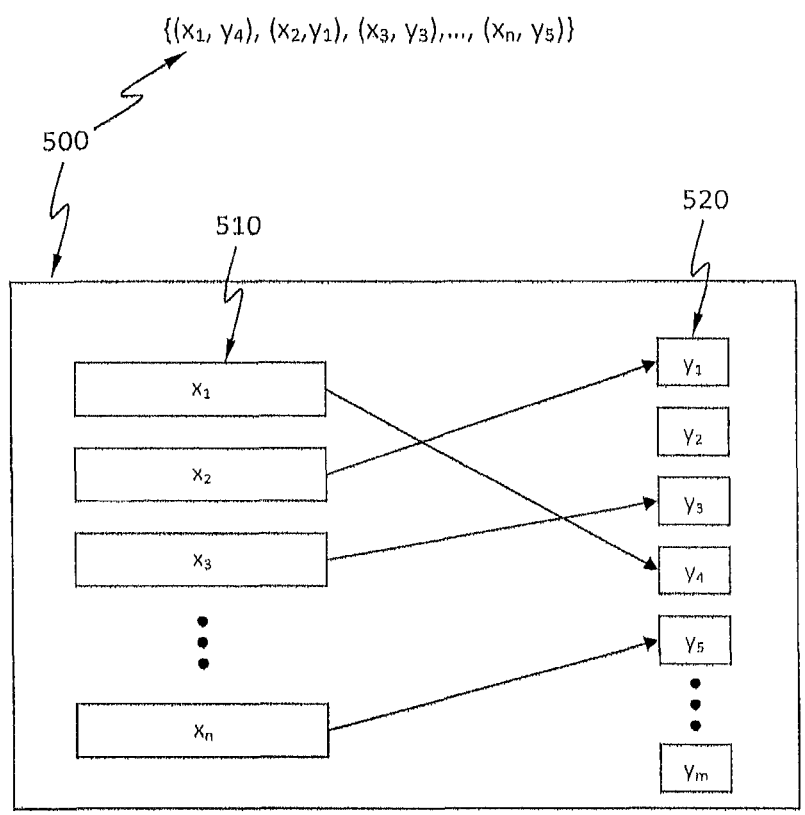
FIG. 5 schematically shows an exemplary training set 500 of labeled data that may be used to train a supervised machine learning model.

FIG. 5 schematically shows an exemplary training set 500 of labeled data $\{(x_1, y_4), (x_2, y_1), (x_3, y_3), \ldots, (x_n, y_5)\}$ that may be used to train a supervised machine learning model. $x_i$ is the feature vector 510 of the i-th example and $y_i$ is its label (i.e., class) 520. In the context of this disclosure, the feature vector 510 may be a vector of the design variables related to the source ("source design variables"); the classes 520 can be as few as two: one class (labeled "G" or "Good") including those positions in the space of the source design variables that are likely to have a local minimum nearby, and the other class (labeled "B" or "Bad") including those positions in the space of the source design variables that are unlikely to have a local minimum nearby. The feature vector may include other design variables.

Figure 6:
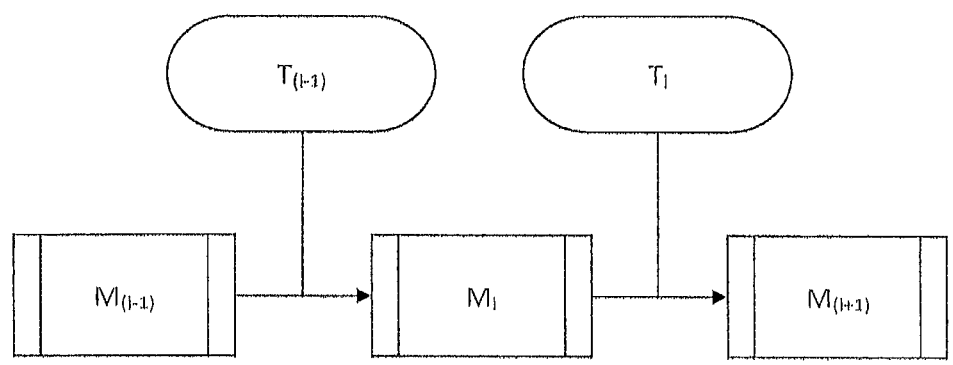
FIG. 6 schematically shows training of a supervised machine learning model.

FIG. 6 schematically shows training of a supervised machine learning model. A supervised machine learning model $M_i$ may be trained with a training set $T_i$ and evolves to a supervised machine learning model $M_{(i+1)}$. The supervised machine learning model $M_i$ is not necessarily "untrained." Instead, the supervised machine learning model $M_i$ may be previously trained with a different training set $T_{(i-1)}$. The training set $T_i$ may not have common element with the training set $T_{(i-1)}$ (i.e., $T_{(i-1)} \cap T_i = \{\ \}$) or may have common element. For example, the training set $T_i$ may be a superset of the training set $T_{(i-1)}$ (i.e., $T_i \supset T_{(i-1)}$), by including additional elements into the training set $T_{(i-1)}$. In an embodiment, the additional elements may be the local minimums found around some randomly selected positions in the design variable space. The training set $T_i$ may include some but not all of the elements of the training set $T_{(i-1)}$. For example, some elements in the training set $T_{(i-1)}$ may be eliminated therefrom and some elements (e.g., local minimums) may be added thereto. In another word, the model may evolve while being used.

Figure 7:
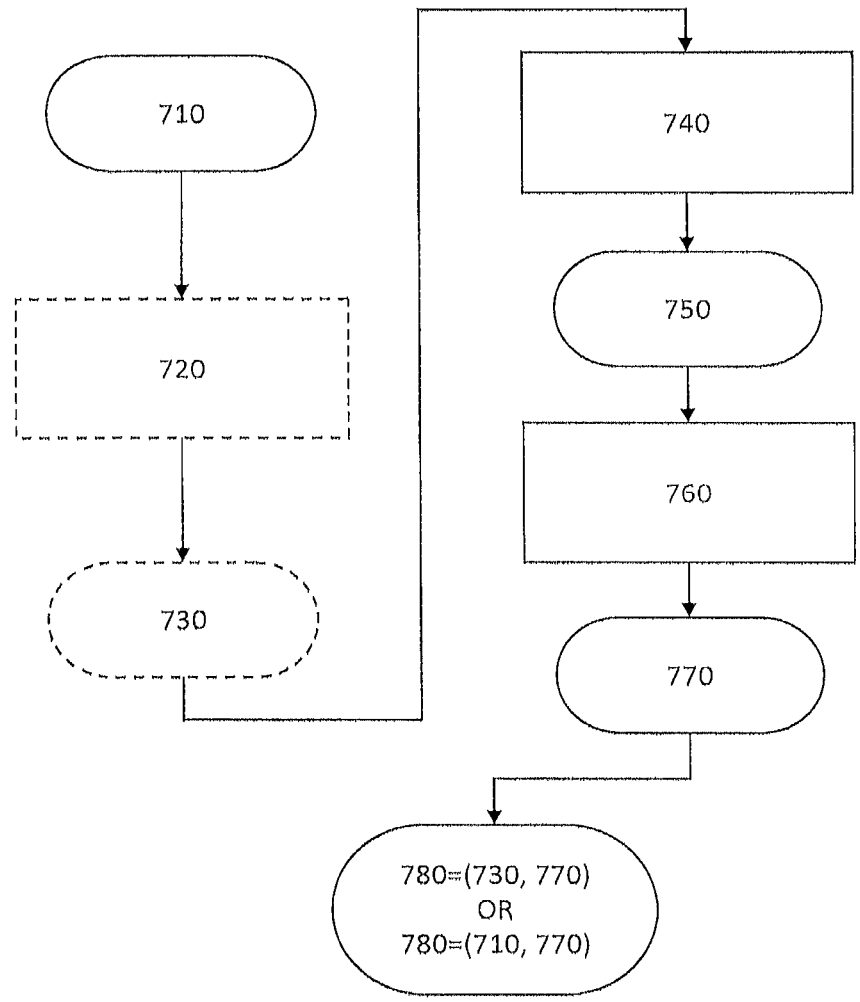
FIG. 7 schematically shows a method for obtaining an element of a training set from a source.

FIG. 7 schematically shows a method for obtaining an element of a training set from a source 710 (e.g., represented by one or more numerical characteristics of the source such as the intensity profile at the source pupil or a position in the source design variables space), according to an embodiment. The source 710 may be a randomly selected position in the source design variable space, for example, obtained using a Monte-Carlo method, or a source at a local minimum in the source design variable space, for example, obtained from a suitable optimization method (e.g., the method of FIG. 3 or FIG. 4). A continuous source is commonly found in lithographic apparatuses using deep UV ("DUV") for exposure. A discrete source is commonly found in lithographic apparatuses using extreme UV ("EUV") for exposure. The term "continuous" as used here means that the intensities at the source pupil can assume any value within a numerical range and the intensity profile is spatially continuous. The term "discrete" as used here means that the intensities at the source pupil can only assume a few discrete values and the intensity profile is spatially discrete. In step 720, the source 710 may be parameterized. For example, one or more numerical characteristics 730 may be obtained from the intensity profile at the source pupil of the source 710. The numerical characteristics 730 may be any suitable characteristics of the source 710. In a very simple example, the numerical characteristics 730 may include intensities at several predetermined positions on the source pupil. The numerical characteristics 730 may include some representation of the symmetry of the intensity profile. In step 740, a cost function 750 may be calculated from the source 710 (or the numerical characteristics 730). In an example, design variables unrelated to the source ("non-source design variables") such as the design variables related to patterning device or the projection optics may be adjusted or optimized for the source 710 first before calculating the cost function. In step 760, the source 710 is designated, based on the cost function 750, into one (the "designated class" 770 of the source 710) of several possible classes (e.g., one "good" class "G" and one "bad" class "B"). For example, if the cost function 750 is below an absolute or relative threshold, the source 710 is designated to be in class "G" and if the cost function 750 is not below the threshold, the source 710 is designated in to be in class "B." In an example, the threshold, the relative threshold may be 10%, 20%, or 30%, etc. in the range between the least and the greatest values of the cost function among the existing elements in the training set. The numerical characteristics 730 may constitute the feature vector and combined with the designated class 770 of the source 710 to form an element 780 of the training set. If the source 710 is a discrete source, the step 720 may be omitted because the intensities at the discrete positions of the intensity profile can themselves constitute the feature vector.

Figure 8:
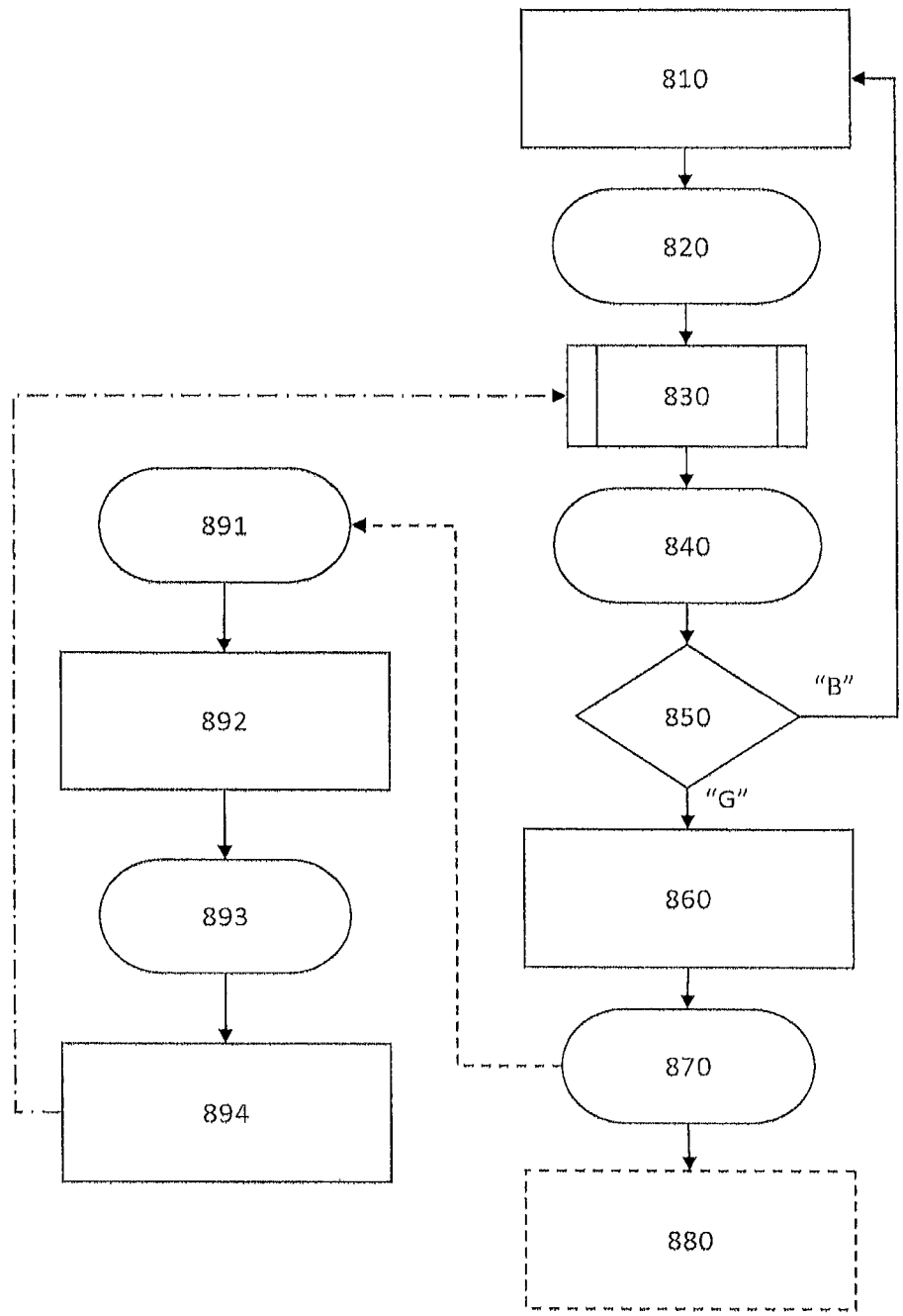
FIG. 8 shows a flow chart of a method for optimizing the source using a Monte-Carlo algorithm and a supervised machine learning model.

FIG. 8 shows a flow chart of a method for optimizing the source using a Monte-Carlo algorithm and a supervised machine learning model. In step 810, an initial position 820 (i.e., an initial source 820) in the source design variable space is obtained from a Monte-Carlo algorithm. A supervised machine learning model (e.g., an SVM) 830 classifies the initial source 820, into a class 840, for example, to be "G" or "B." In step 850, if the class 840 is "B," no further steps are carried out and the flow goes back to step 810 to obtain the next initial position in the source design variable space; if the class 840 is "G," the flow continues to step 860 where the source is adjusted to an adjusted source 870 (e.g., finding local minimum of a cost function around the initial source 820). In optional step 880, non-source design variables (e.g., any combination of design variables of the patterning device and the projection optics) are adjusted using any suitable method (e.g., finding local minimum of a cost function by adjusting the non-source design variables). The adjusted source 870 may be used to update the training set and retrain the supervised machine learning model 830. For example, a new element 891 may be generated using the method of FIG. 7 from the adjusted source 870. In step 892, the training set may be updated with the new element 891 to generate an updated training set 893, which can be used in step 894 to retrain the supervised machine learning model 830.

Figure 9:
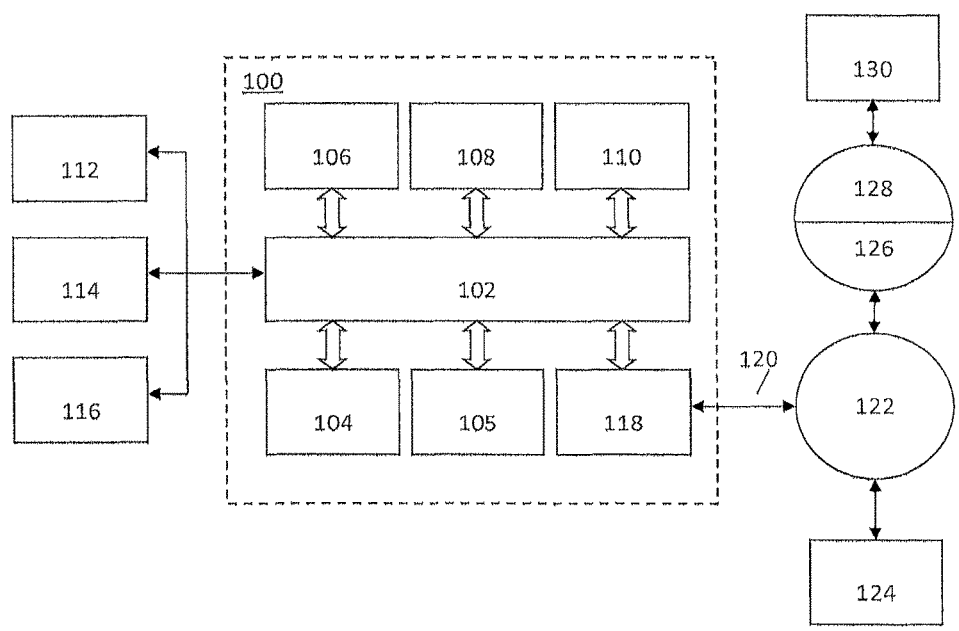
FIG. 9 is a block diagram of an example computer system in which embodiments can be implemented.

FIG. 9 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 10:
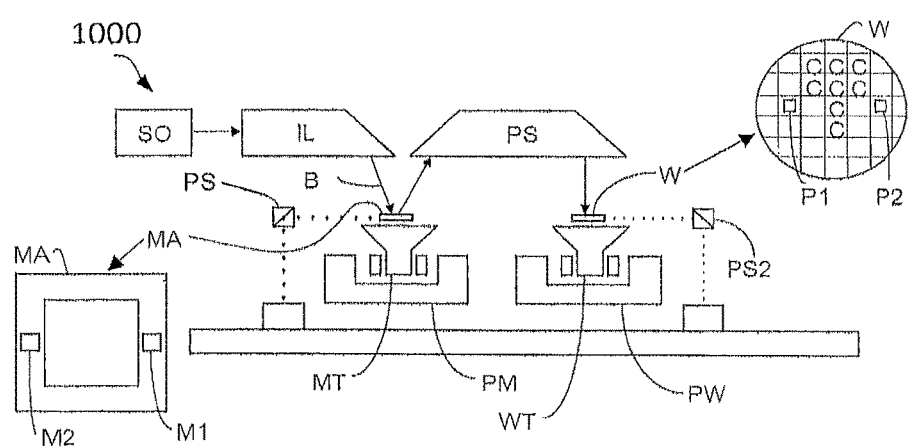
FIG. 10 is a schematic diagram of another lithographic projection apparatus.

FIG. 10 schematically depicts another exemplary lithographic projection apparatus 1000 whose illumination source could be optimized utilizing the methods described herein.

The lithographic projection apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 10, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 10, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
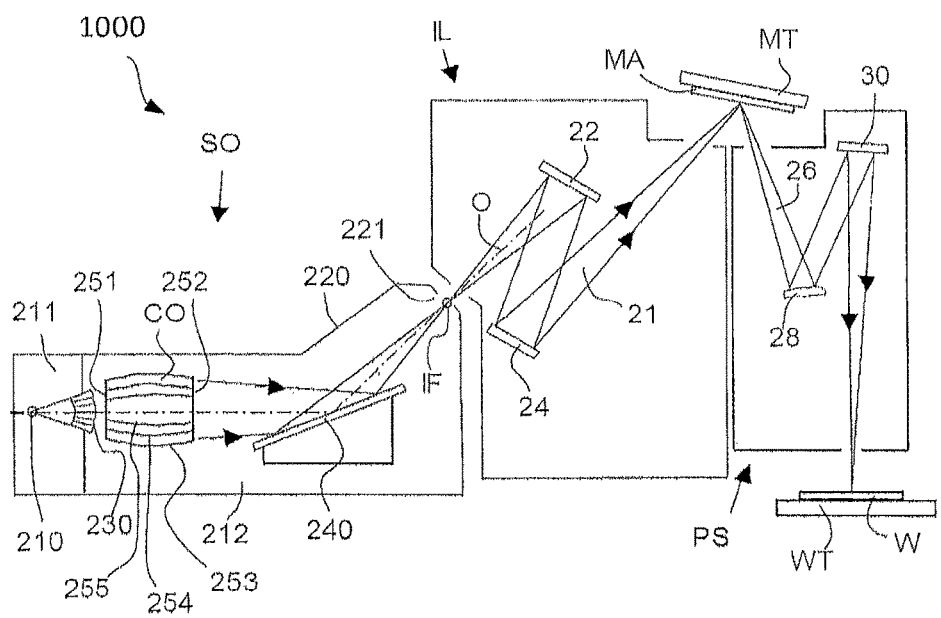
FIG. 11 is a more detailed view of the apparatus in FIG. 10.

FIG. 11 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 12:
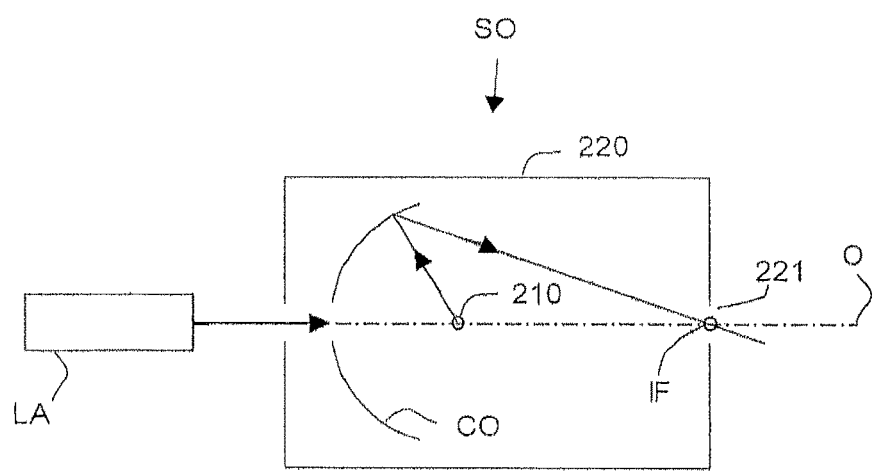
FIG. 12 is a more detailed view of the source collector module SO of the apparatus of FIG. 10 and FIG. 11.

Alternatively, the source collector module SO may be part of an LPP radiation system as shown in FIG. 12. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A computer-implemented method for improving a lithographic process for imaging a portion of a design layout onto a substrate using a lithographic apparatus, the method comprising:
   obtaining a first source of the lithographic apparatus;
   classifying the first source into a class among a plurality of possible classes, based on one or more numerical characteristics of the first source, using a machine learning model, by a computer;
   determining whether the class is among one or more predetermined classes;
   only when the class is among the one or more predetermined classes, adjusting one or more source design variables to obtain a second source.

2. The method of clause 1, further comprising: only when the class is among the one or more predetermined classes, adjusting non-source design variables.

3. The method of clause 1, wherein the machine learning model is supervised.

4. The method of clause 1, wherein the machine learning model is selected from a group consisting of Decision trees, Ensembles (Bagging, Boosting, Random forest), k-NN, Linear regression, Naive Bayes, Neural networks, Logistic regression, Perceptron, Support vector machine (SVM), Relevance vector machine (RVM), and deep learning.

5. The method of clause 1, wherein the machine learning model is non-probabilistic.

6. The method of clause 1, wherein the machine learning model is a binary non-linear classifier.

7. The method of clause 1, wherein the machine learning model uses a kernel method.

8. The method of any one of clauses 1 to 7, wherein the machine learning model is trained with a training set comprising elements of feature vectors and classes of the feature vectors, wherein the feature vectors comprise one or more numerical characteristics of a source of the lithographic apparatus.

9. The method of any one of clauses 1 to 8, wherein a class is determined from either of two classes.

10. The method of any one of clauses 1 to 9, wherein the first source is obtained by randomly selecting a point in a space of the one or more source design variables.

11. The method of any one of clauses 1 to 9, wherein the first source is obtained by a Monte-Carlo method.

12. The method of any one of clauses 1 to 9, wherein in the first source is obtained from optimizing a source of the lithographic apparatus by adjusting the one or more source design variables and optionally one or more non-source design variables.

13. The method of any one of clauses 1 to 9, wherein in the first source is obtained by optimizing a source of the lithographic apparatus.

14. The method of clause 13, wherein the source is optimized simultaneously with the portion of the design layout.

15. The method of any one of clauses 1 to 14, wherein the source is a discrete source.

16. The method of any one of clauses 1 to 14, wherein the source is a continuous source.

17. The method of any one of clauses 1 to 16, further comprising generating an element with the second source.

18. The method of clause 17, further comprising updating a training set with the element to obtain an updated training set.

19. The method of clause 18, further comprising training the machine learning model with the updated training set.

20. The method of any one of clauses 1 to 19, wherein the lithographic process uses extreme ultraviolet light to image the portion of the design layout onto the substrate.

21. A computer-implemented method for obtaining an element of a training set from a source of a lithographic apparatus suitable for a lithographic process for imaging a portion of a design layout onto a substrate, the method comprising:
   calculating a value of a cost function from the source;
   designating a class of for the source among a plurality of possible classes, based on the value of the cost function; and
   forming the element by combining numerical characteristics of the source and the class.

22. The method of clause 21, further comprising adjusting non-source design variables before calculating the value of the cost function.
23. The method of any one of clauses 21 to 22, wherein the plurality of possible classes consist of two classes.
24. The method of any one of clauses 21 to 23, determining the class is based on an absolute or relative threshold.
25. The method of any one of clauses 21 to 24, wherein the source is a discrete source.
26. The method of clause 25, wherein the numerical characteristics comprise intensities at a plurality of positions at a source pupil of the source.
27. The method of any one of clauses 21 to 24, wherein the source is a discrete source is a continuous source.
28. The method of any one of clauses 21 to 27, further comprising parameterizing the source so as to obtain the numerical characteristics.
29. A computer-implemented method for improving a lithographic process for imaging a portion of a design layout onto a substrate using a lithographic apparatus, the method comprising:
  optimizing a source by adjusting one or more source design variables;
  optionally optimizing another parameter of the lithographic process by adjusting one or more non-source design variables;
  wherein the source is in one or more predetermined classes among a plurality of possible classes, as determined by a machine learning model based on one or more numerical characteristics of the source.
30. The method of clause 29, wherein the machine learning model is trained with a training set comprising elements of feature vectors and classes of the feature vectors, wherein the feature vectors comprise one or more numerical characteristics of a source of the lithographic apparatus.
31. The method of any of clause 29 to 30, further comprising obtaining the source by randomly selecting a point in a space of the one or more source design variables.
32. The method of clause 31, wherein the source is obtained by a Monte-Carlo method.
33. A computer program product comprising a computer readable medium having instructions recorded thereon, the instructions when executed by a computer implementing the method of any of the above clauses.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method for improving imaging a portion of a design layout onto a substrate using a lithographic apparatus, the method comprising:
  classifying, by a hardware computer system and a machine learning model, a first illumination source of the lithographic apparatus into a class among a plurality of possible classes, based on one or more numerical characteristics of the first illumination source, the machine learning model developed on illumination source numerical characteristics in order to classify illumination sources;
  determining that the class of the first illumination source is among one or more predetermined classes of the plurality of possible classes; and
  only when the class of the first illumination source is among the one or more predetermined classes, adjusting one or more illumination source design variables to obtain a second illumination source.
2. The method of claim 1, further comprising, only when the class of the first illumination source is among the one or more predetermined classes, adjusting one or more non-illumination source design variables.
3. The method of claim 1, wherein the machine learning model is supervised.
4. The method of claim 1, wherein the machine learning model is selected from: Decision trees, Ensembles (Bagging, Boosting, Random forest), k-NN, Linear regression, Naive Bayes, Neural networks, Logistic regression, Perceptron, Support vector machine (SVM), Relevance vector machine (RVM), and/or deep learning.
5. The method of claim 1, wherein the machine learning model is non-probabilistic, or wherein the machine learning model is a binary non-linear classifier.
6. The method of claim 1, wherein the machine learning model uses a kernel method.
7. The method of claim 1, wherein the machine learning model is trained with a training set comprising elements of feature vectors and classes of the feature vectors, wherein the feature vectors comprise one or more numerical characteristics of an illumination source of the lithographic apparatus.
8. The method of claim 1, wherein the plurality of possible classes consists of two classes and a class is determined from either of the two classes of the plurality of possible classes.
9. The method of claim 1, wherein the first illumination source is obtained by randomly selecting a point in a space of the one or more illumination source design variables, or wherein the first illumination source is obtained by a Monte-Carlo method, or wherein in the first illumination source is obtained from optimizing an illumination source of the lithographic apparatus by adjusting one or more illumination source design variables.
10. The method of claim 1, further comprising obtaining the first illumination source by optimizing an illumination source of the lithographic apparatus.
11. The method of claim 10, wherein the illumination source is optimized simultaneously with the portion of the design layout.
12. The method of claim 1, further comprising generating an element with the second illumination source.
13. The method of claim 12, further comprising updating a training set with the element to obtain an updated training set.
14. The method of claim 13, further comprising training the machine learning model with the updated training set.
15. A computer program product comprising a non-transitory computer readable medium having instructions recorded thereon, the instructions, upon execution by a hardware computer system, configured to cause the hardware computer system to at least:
  classify, by a machine learning model, a first illumination source of the lithographic apparatus into a class among a plurality of possible classes, based on one or more numerical characteristics of the first illumination source, the machine learning model developed on illumination source numerical characteristics in order to classify illumination sources;

determine whether the class of the first illumination source is among one or more predetermined classes of the plurality of possible classes; and only when the class of the first illumination source is among the one or more predetermined classes, adjust one or more illumination source design variables to obtain a second illumination source.

16. The computer program product of claim 15, wherein instructions are further configured to, only when the class of the first illumination source is among the one or more predetermined classes, adjust one or more non-illumination source design variables.

17. The computer program product of claim 15, wherein the machine learning model is supervised.

18. The computer program product of claim 15, wherein the machine learning model is non-probabilistic, or wherein the machine learning model is a binary non-linear classifier, or wherein the machine learning model uses a kernel method.

19. The computer program product of claim 15, wherein the machine learning model is trained with a training set comprising elements of feature vectors and classes of the feature vectors, wherein the feature vectors comprise one or more numerical characteristics of an illumination source of the lithographic apparatus.

20. The computer program product of claim 15, wherein the plurality of possible classes consists of two classes and a class is determined from either of the two classes of the plurality of possible classes.

* * * * *